United States Patent [19]

Schroder et al.

[11] 3,973,270

[45] Aug. 3, 1976

[54] CHARGE STORAGE TARGET AND METHOD OF MANUFACTURE

[75] Inventors: Dieter K. Schroder; Robert A. Wickstrom, both of Pittsburgh, Pa.

[73] Assignee: Westinghouse Electric Corporation, Pittsburgh, Pa.

[22] Filed: Mar. 18, 1975

[21] Appl. No.: 559,466

Related U.S. Application Data

[63] Continuation of Ser. No. 519,160, Oct. 30, 1974, which is a continuation of Ser. No. 241,045, April 4, 1972, abandoned.

[52] U.S. Cl. ............................... 357/31; 313/367
[51] Int. Cl.² ..................................... H01L 31/00
[58] Field of Search ............... 357/31, 30; 313/66

[56] References Cited
UNITED STATES PATENTS

| | | | |
|---|---|---|---|
| 3,676,727 | 7/1972 | Dalton | 313/66 |
| 3,707,657 | 12/1972 | Veith | 317/235 R |
| 3,737,701 | 6/1973 | Kovi | 313/66 |
| 3,737,702 | 6/1973 | Kovi | 313/66 |
| 3,746,908 | 7/1973 | Engeler | 315/10 |

*Primary Examiner*—Martin H. Edlow
*Attorney, Agent, or Firm*—W. G. Sutcliff

[57] ABSTRACT

A charge storage device of the type in which a target electrode provides a plurality of spatially distributed charge storage sites formed on an output side of a semiconductor wafer with means associated with the storage sites for sensing and converting the charge on the storage sites into an electrical signal. Input excitation is directed onto the other or input side of the semiconductor wafer and may be in the form of electrons or light capable of generating electron-hole pairs within the semiconductor wafer which diffuse through to the storage sites. The output side of the semiconductor wafer is provided with an apertured insulating layer with a reading electron beam making contact through the apertures in the insulating coating to the spatially distributed storage sites. This invention is directed to improvements in the storage sites within the apertures of the insulating layer of said target electrode so that electron contact areas extend above the surface of the insulating layer and overlap at least a portion of the adjacent insulating layer and to methods of manufacturing said target electrode.

7 Claims, 16 Drawing Figures

CHARGE STORAGE TARGET AND METHOD OF MANUFACTURE

This is a continuation of application Ser. No. 519,160, filed Oct. 30, 1974, which application, in turn, is a continuation of application Ser. No. 241,045, filed April 4, 1972, and now abandoned.

BACKGROUND OF THE INVENTION

This invention is generally directed to a charge storage target for utilization within a pickup tube. The specific application is a target that utilizes a semiconductor wafer of a first type of conductivity with a mosaic of regions of an opposite type of conductivity to the wafer provided on one surface of the wafer and forming junctions with the wafer. The mosaic of regions forms storage sites and is scanned by a reading electron beam. Input radiation in the form of electrons or light are directed into the wafer from the opposite side with respect to the reading electron beam and generate electron-hole pairs which diffuse to the junctions formed in the wafer. The regions or junctions are separated from each other and form a rectifying junction with the semiconductor wafer or substrate. The junctions are provided with a reverse bias and the minority carriers discharge this reverse bias. The amount of electron beam current utilized by the reading beam in depositing a charge on the storage site to recharge the diode is the output signal. One specific type is described in U.S. Pat. No. 3,011,089, issued to F. W. Reynolds on November 28, 1961, and U.S. Pat. No. 3,403,284 by T. M. Buck et al. issued Sept. 24, 1968. These devices are generally referred to as diode array targets. A further extension of the light input type target is the use of a structure in which the input light image is first focused onto a photocathode and the emitted photoelectrons from a photocathode are in turn accelerated by an electric field and focused onto the front surface of the target. The carriers generated by the photoelectrons have the same function as the photogenerated carriers described above.

To allow the scanning reading electron beam to land on the individual diode regions positioned in apertures of an insulating coating without being deflected by charge which tends to build up on the surrounding insulating layer two main approaches have been utilized. The first is to cover the whole read side of the target with a resistive layer which allows this charge to leak off of the insulating coating to the diodes. Such a structure is shown in FIG. 3. A second approach is to cover most of the insulating coating with conductive contact pads which extend out from each diode region and are separated by a very narrow region of exposed oxide coating. FIGS. 4 and 5 illustrate this approach to the problem. The resistive coating approach is found to degrade the resolution of the target in that the resistive coating by its very nature is a charge leakage path which allows some discharge between adjacent diodes. A further problem associated with this approach is that a high resistance path is placed between the reading electron beam and the diodes. This makes for a less efficient recharging of the diodes and the lag of this type of target tends to be relatively high.

The second approach illustrated in FIG. 4 utilizes conductive p+ silicon bumps or contacts which are grown epitaxially. This approach overcomes the leakage between the diode problems and also does not have a disadvantage of the beam resistance of the previous approach. The disadvantage of the structure as shown in FIG. 4 is the sloping sides of the contact, limit the height that the contacts can be grown since the contacts must not touch. Another modification of the second approach is illustrated in FIG. 5 and has the advantages of FIG. 4 but the disadvantages that the fabrication process requires a second photomask step for delineation of the conducting pads.

SUMMARY OF THE INVENTION

This invention is directed to a charge storage device and method of manufacture which includes a wafer of semiconductive material having discrete storage sites and of the type referred to above as a diode type target. The improved target utilizes the conducting bump or contact structure and therefore obtains the advantages of the prior art devices shown in FIGS. 4 and 5. It has the additional advantage that the height of the bump above the semiconductor substrate is controlled by etching away selected portions of the wafer to provide a pillar-like extension from the body or substrate portion and hence the subtrate portion can be significantly below the bump giving good beam landing behavior. Furthermore, only one photomask step is required and because the junction is a mesa-type than a planar, the capacitance will be lower with improved lag characteristics. In addition, the structure also adapts itself to the provision of barrier regions between the individual diodes to prevent blooming of the target under intense input radiation.

BRIEF DESCRIPTION OF THE DRAWINGS

For a better understanding of the invention, reference may be had to the preferred embodiments, exemplary of the invention, shown in the accompanying drawings, in which.

DESCRIPTION OF THE PREFERRED EMBODIMENT

Figure 1:
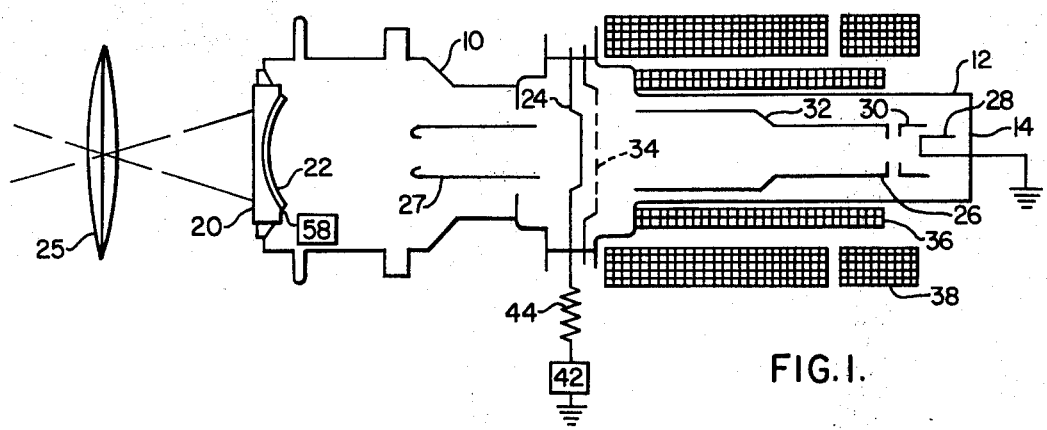
FIG. 1 is a schematic diagram of a pickup tube in accordance with the teachings of this invention.

In FIG. 1, there is illustrated a pickup tube comprised of an evacuated envelope 10 including a tubular body portion 12 having a button stem 14, provided at one end thereof for closing off that end of the tubular portion 12. The button stem 14 also includes a plurality of lead-ins (not shown) for applying potentials to the electrodes within the envelope 10. The other end of the tubular member 12 is closed off by a faceplate 20. The faceplate 20 is of a suitable material transmissive to the input radiations from the scene to be viewed. A suitable material for the faceplate 20 is glass or quartz. The faceplate 20 may be of a fiber optic type construction. A photocathode 22 is provided on the inner surface of the faceplate 20. The photocathode 22 may be of a suitable material responsive to the input radiations such as a multi-alkali photocathode material. The photocathode 22 will absorb radiations directed thereon from the scene and focused thereon by a suitable lens 25. A target member 24 is provided between the photocathode 22 and a reading electron gun 26. Photoelectrons emitted by the photocathode 22 are focused by suitable means such as an electrode 27 onto the target 24. Suitable structures for imaging the photoelectrons onto the target are well known and are described in volumes 1 and 2 of Photoelectronic Imaging Devices, Plenum Press, New York-London, 1971.

The electron gun 26 is provided at the opposite end of the envelope 10 with respect to the target 24 and generates a pencil-like electron beam for scanning a raster over the target 24. The electron gun 26 is comprised of a cathode 28 which may be at ground potential. A control grid 30 and a focusing electrode 32 may also be provided in the electron gun 26. A grid member 34 may be provided adjacent the target member 24 and may be at a potential of about 500 volts positive with respect to ground. The electron gun 26 may be focused by either electrostatic or electromagnetic means. An electromagnetic focusing coil 36 is provided about the outer portion of the tubular member 12. The deflection means may also be electrostatic or electromagnetic and in this specific device is shown as an electromagnetic coil 38 for deflection of electron beam so as to scan a raster over the target 24. The photocathode 22 may be connected to a high potential source of about 10,000 volts negative with respect to ground provided by a potential source 58. The target member 24 is provided with a suitable potential of about 10 volts positive with respect to ground by means of a potential source 42. A resistor 44 is also provided between the voltage source 42 and the target 24 for deriving the output signal from the device.

Figure 2:
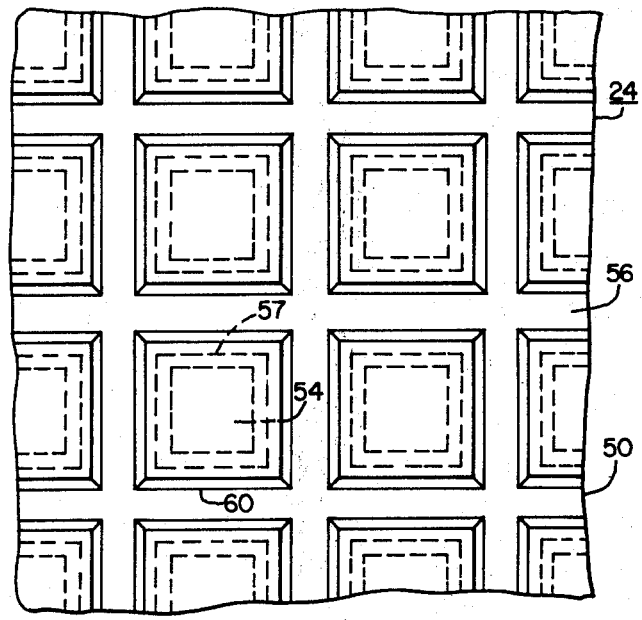
FIG. 2 is a plan view of a fragment of the scan surface of the target electrode of FIG. 1.
Figure 3:
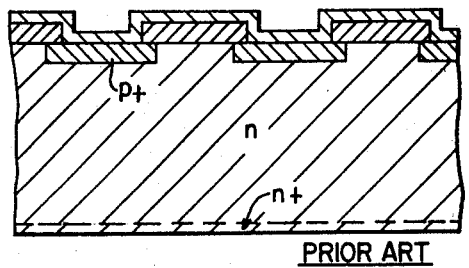
FIGS. 3, 4 and 5 illustrate partial sectional views of prior art target electrodes.
Figure 4:
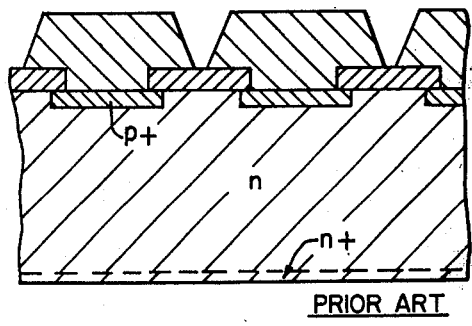
Figure 5:
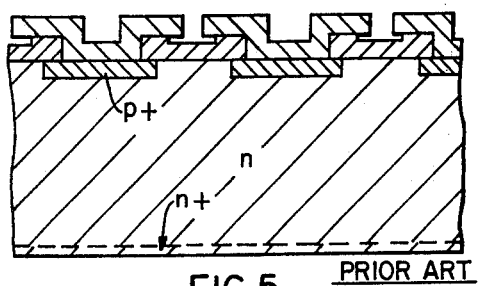
Figure 6:
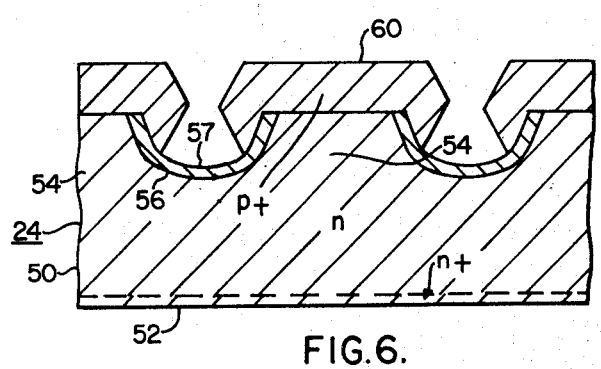
FIG. 6 is a sectional view of a portion of the target electrode illustrated in FIGS. 1 and 2.

The target structure 24 is a diode target array and is shown in more detail in FIGS. 2 and 6. The target 24 is comprised of a body or substrate 50 which may be of a suitable semiconductive material such as silicon, germanium, or indium arsenide. In the specific device illustrated in FIG. 6, the substrate 50 is of an n type silicon type material having a resistivity of about 10 ohm-centimeters. The crystal orientation of the wafer may be of any suitable type of other than (111), such as (100) or (110). The input side of the target 24, that is, the side facing the photocathode 22 is provided with an n+ layer 52. The n+ layer 52 serves not only as the electrical contact of the target, but also establishes a field to prevent holes from recombining at the surface. The opposite side of the body 50 remote from the cathode 22 which is the read or the output side of the target 24 is provided with a plurality of pillars 54 extending from the substrate 50. The pillars 54 extend for a distance of about 4 microns above the upper surface of the body 50. The pillars 54 are formed from the wafer by etching out the surrounding portions of the wafer to provide a recessed surface 56. The distance from the recessed surface 56 and the opposite or input surface of the wafer is about 10 microns. The recessed surface 56 as well as the vertical walls of the pillars 54 are provided with an insulating coating 57 of a suitable insulating material such as silicon dioxide. The thickness of the coating 57 may be about 0.5–1 microns. A conductive contact 60 is provided on the top of each of the pillars 54 and the conductive contact 60 covers not only the upper portion of the pillar 54 but extends out over the insulating coating 57 provided on the walls of the pillars 54 and the recessed surface 56 so as to provide a gap of about 2 microns between the adjacent conductive contacts 60.

Figure 7:
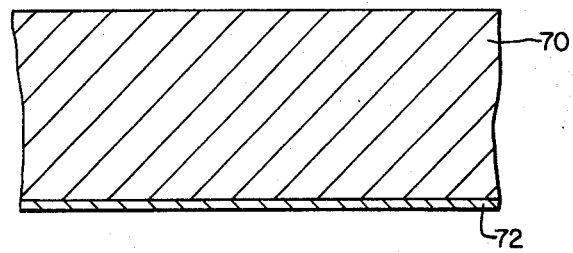
FIGS. 7 through 9 illustrate fragmentary sectional views of steps in the manufacture of the target illustrated in FIGS. 2 and 6.
Figure 8:
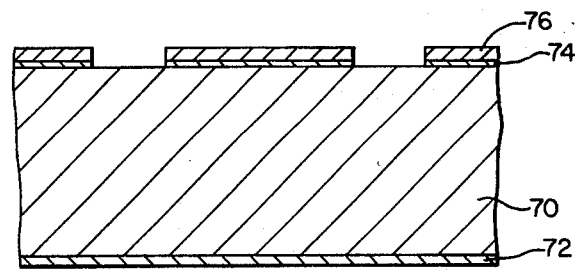

In the fabrication of the target set forth in FIG. 6, a wafer 70 of a suitable n-type silicon is obtained having a resistivity of about 10 ohm centimeter with a diameter of about 1.25 inches and a thickness of about 0.008 inch. For the silicon deep etch technique, wafer orientations other than the (111) may be used. For both the (110) and (100) orientation, preferential silicon etches can be used that etch deep vertically but negligibly in the lateral direction. This permits very deep moats to be formed about the pillars 54. The first step in the operation is to oxidize the wafer 70 to provide a coating 72 of about 10,000 angstroms of silicon dioxide on the wafer 70. This oxidized coating 72 may be provided by thermal oxidation at about 1100°C for 3 hours in an atmosphere of wet oxygen. The next step in the operation is to remove the oxide coating 72 from the wafer 70 with the exception of the input side to provide a structure as illustrated in FIG. 7. A suitable etch for this removal is hydrofluoric acid. The next step is providing a suitable etch mask on the upper or output surface of the wafer 70. This may be accomplished by first growing a coating 74 of about 1000 angstroms in thickness of silicon nitride $Si_3N_4$ on the output side of the wafer 70. This may be accomplished by chemical vapor deposition. Next, a coating 76 of silicon dioxide of a thickness of about 2000 angstroms is provided over the silicon nitride coating 74. This may be accomplished by a simple chemical vapor deposition on top of the silicon nitride coating 74. Next a coating of photoresist is provided on top of the silicon dioxide coating 76. A suitable resist is a negative acting resist. The photoresist layer is then exposed by suitable radiation through a mask by well known techniques so that the areas exposed to light become less soluble and the unexposed areas which are soluble can be removed by washing to leave a mosaic pattern of photoresist on the silicon dioxide layer 76. This pattern is generally illustrated in FIG. 2. A suitable etch is then utilized to etch away the exposed portion of the silicon dioxide layer 76 through the photoresist layer 78. This may be accomplished with a buffered hydrofluoric acid which consists of 6 parts of ammonium fluoride to one part of hydrofluoric acid. The remaining insoluble portion of the photoresist layer 78 may be removed with a suitable resist remover. The silicon nitride layer 74 is then subjected to a suitable etch such as hot phosphoric acid at about 185° for about 25 minutes which removes the exposed portion of silicon nitride layer through the silicon dioxide. The resulting structure is illustrated in FIG. 8 and provides a suitable etch mask for the silicon wafer 70.

Figure 9:
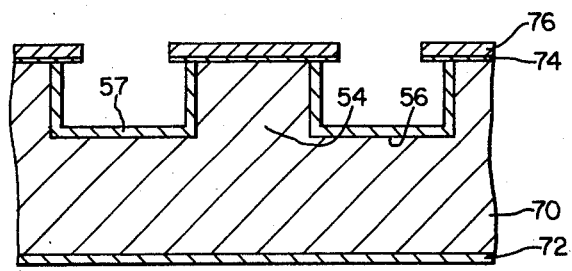

The next step in the operation is to etch the silicon wafer 70 through the etch mask comprised of the mosaic pattern of layers 74 and 76 with a solution of about 25 milliliters of $HNO_3$ and 10 milliliters of acetic acid and 3 milliliters of hydrofluoric acid for about 90 seconds. This etching operation etches downward and also slightly beneath the etch pattern mask to form moat portions around the pillars 54. In this operation, the wafer 70 is etched to a depth of about 4 microns and the distance between pillars 54 is about 8 microns. The next step is to oxidize the wafer 70 to provide the coating 57 which has a thickness of about 10,000 angstroms. This may be accomplished by thermal oxidation at 1100°C for 3 hours in wet oxygen. The coating 57 covers the recessed surface 56 and the sides of the pillars 54 as shown in FIG. 9. The next step in the operation is to etch away the silicon dioxide layer 76 formed on the silicon nitride layer 74 and this may be accomplished by utilizing buffered hydrofluoric acid. This etch will reduce the thickness of layer 57. After the silicon dioxide layer 76 has been removed from the silicon nitride layer 74, the silicon nitride layer 74 is removed by etching with hot phosphoric acid at about 185° for about 30 minutes.

The next step in the operation is to grow the epitaxial contacts 60. The height of the growth contact 60 should be about 4–6 microns and the diameter of the growth contact 60 will be about 10 microns. A sectional view of the growth is shown in FIG. 6. The spacing between contacts will be about 2 microns. The epitaxial growth may be accomplished by the hydrogen reduction of $SiCl_4$ doped with $B_2H_6$ in the presence of HCl injection. This technique is more fully described in an article entitled "Selective Growth of Epitaxial Silicon and Gallium Arsenide" by P. Rai-Chordbury and D. K. Schroder in the Journal of Electrochemical Society, January, 1971, Volume 118. The next step is to etch off the oxide layer 72 from the input surface of the wafer 70 by use of a suitable etch such as buffered hydrofluoric acid. The next step is thinning of the wafer 70. If one desires, an outer peripheral support rim of the wafer 70 may be provided by masking the outer periphery with a suitable masking material such as evaporated chrome and gold. The thinning step etches away a portion of the input surface of the wafer 70 so as to provide a thickness between the recessed surface 56 and the input surface of about 10 microns. A suitable etch is 25 milliliters of $HNO_3$, 10 milliliters of acetic acid and 6 milliliters of HF for about 70 minutes. The next step is to diffuse the layer 52 into the input surface and this may be accomplished by diffusing $POCl_3$ for about 45 minutes at 900°C. This provides the n+ layer 52 having a concentration of about $10^{+20}$ $cm^{-3}$. The next operation is to hydrogen anneal the wafer at 400°C for about 60 minutes. It should also be pointed out that the epitaxial growth 60 may be diffused into the pillar 54 for a given distance by treatment for about 45 min. at 1100°C temperature. This will provide a graded junction rather than a sharp junction. If desired, a diffusion coating could be applied prior to the forming of the etching mask and diffusion accomplished either at that time or after the removal of the etching mask. This diffusion region would be in addition to the epitaxial contact 60 as explained in the above structure.

Figure 11:
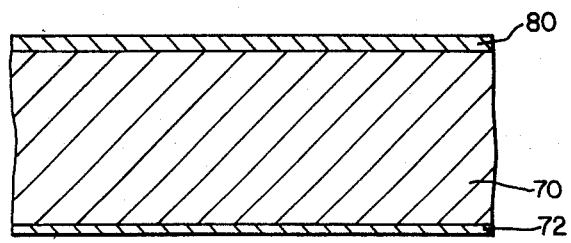
FIGS. 11, 12 and 13 illustrate fragmentary sectional views of steps in the manufacture of the target structure shown in FIG. 10.
Figure 12:
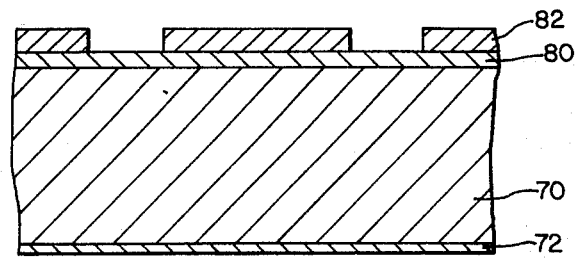
Figure 13:
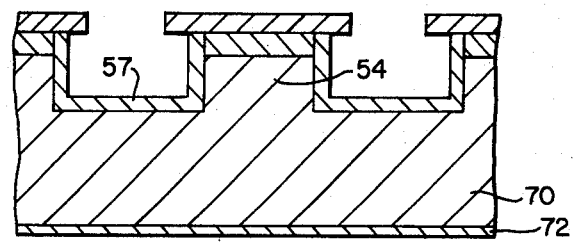
Figure 10:
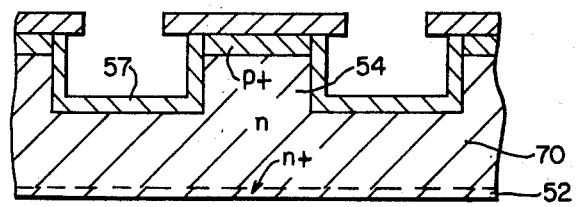
FIG. 10 illustrates a modification of the target that may be incorporated in FIG. 1.

FIG. 10 illustrates another embodiment in which the fabrication steps are very similar to that described with respect to FIG. 6 with the exception that instead of an etching mask of the silicon nitride layer 74 and the oxide layer 76, a metal etch mask is utilized. This metal should be able to serve as the etch mask for silicon and must be able to endure high temperature operational steps. Suitable refractory metals such as molybdenum may be used. In this embodiment, the metal serves the dual purpose of the etch mask and also the metallic contact to the individual diodes. The fabrication of such a device is illustrated in FIGS. 11, 12 and 13. Again, a suitable wafer 70 is provided and oxidized on both surfaces and then the oxide coating is removed from the output surface and a p+ layer 80 is diffused to the depth of about 1–2 microns. The depth of the diffusion is not critical as it is in the planar process since lateral limitations are not present. The structure is illustrated in FIG. 11. The next step in the fabrication is to either evaporate the metal material onto the diffused layer 80 through a mask to form the desired mosaic pattern layer 82 or to apply a continuous coating and then utilize a suitable photoresist technique. The result by either process is shown in FIG. 12. The next step in the fabrication is to etch the silicon wafer 70 as previously explained to provide the moats and pillars 54 and after this step is accomplished, then the silicon dioxide coating 57 is provided on the recessed surface 56 and the walls of the pillars 54 to provide structure shown in FIG. 13. The other processing steps are provided as explained with regard to FIG. 6 to provide the finished target shown in FIG. 10.

Figure 15:
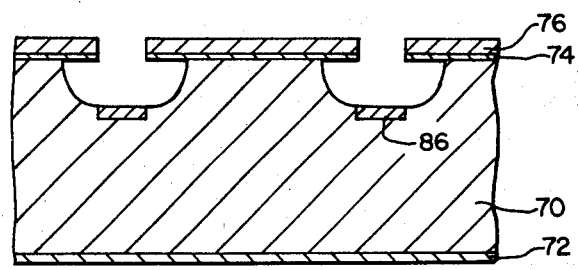
FIGS. 15 and 16 illustrate fragmentary sectional views of steps in the manufacture of the target structure shown in FIG. 14.
Figure 16:
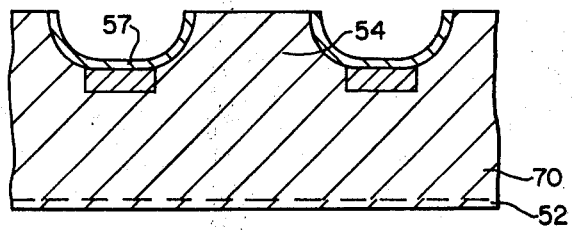
Figure 14:
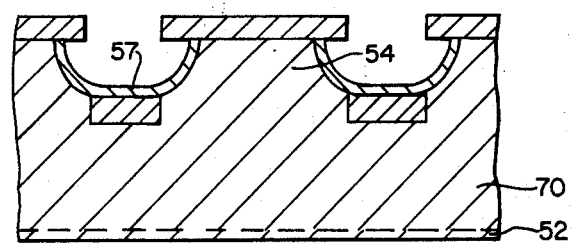
FIG. 14 is a fragmentary sectional view of another modified storage electrode structure that may be incorporated into FIG. 1.

In FIG. 14, a modification is illustrated that may be utilized with regard to either FIGS. 6 or 10. In order to incorporate this modification into the two previous structures, prior to applying the silicon dioxide coating 57 on the recessed surface 56 and the walls of the pillars 54, n+ ions such as phosphorus ions are implanted into the recess surface 56 as illustrated in FIG. 15 to form n+ region 86. The etch masking configuration is sufficiently thick in either of the embodiments of FIGS. 6 and 10 so that the ions cannot penetrate through it. Alternately, one could evaporate an oxide doped with an n-type dopant such as phosphorus. Again, it will only land on the "line of site" portions of the recessed surface 56. The wafer 70 is then heat treated to drive the n-type dopant into the n-type bulk of the wafer 70. The doped oxide is etched without changing the masking layer. The structure is then thermally oxidized using the masking layer to prevent oxidation as in the technique set forth with regard to FIGS. 6 and 10 and shown in FIG. 16. The remaining steps in the fabrication are set forth with regard to FIG. 6 and the resulting structure is shown in FIG. 14. It should be noted that only one photolithography operation was necessary as in the previous structures and yet the n+ regions 86 were ion implanted prior to oxidation assuring a high quality low dark current silicon, silicon dioxide interface. During the further oxidation and diffusion steps, the n+ regions 86 are driven deeper into the structure, assuring more complete isolation of the individual diodes. In addition, the n+ regions 86 are already closer to the front surface diffusion layer 52 as a result of the deep etch technique. In the limit, they can of course, be driven until they touch the layer 52. Another advantage is that compared to previous structures where the distance between an n+ region 86 and the p+ region 60 is relatively small, there is always danger that they can merge in drive in process for the n-type regions 86. With silicon deep etch, the distance is substantially increased as a result thereof.

It is also possible to make the region 86 p-type. Again, the ion could be ion implanted or used to doped oxide process. In this case, it would be necessary to bias the p-type region 86.

The diode junction may be formed by a diffusion technique, and although this device will function, the structures shown in FIGS. 6, 10 and 14 are superior due to the reasons previously indicated. It is obvious that other techniques may be utilized to provide the etching mask such as electron beam photoresist techniques. As a result of the mesa-like structure of diodes, the junction capacitance is significantly reduced from prior art structures. The side wall capacitance of standard planar diffusion is absent. Furthermore, in the prior art the beam accepting layer is on the oxide coating and over the n-type substrate. This introduces a significant capacitance component. In the structure described herein, the epitaxial silicon contact 60 only grows on the oxide coating 56 overlying the p+ region and hence no additional capacitance is introduced. These two capacitance reductions improve the lag characteristics greatly. Since the conducting contact 60 is situated significantly above the oxide over the n-type substrate, oxide charging will be negligible. The deep moats can be fabricated such that the blooming characteristics of the target can be significantly improved by forcing the light generated electron-hole pairs to diffuse to the p+ regions. The feature of deep etching and conducting, overhanging contacts will also improve the X-ray resistance of the target.

In the operation of the device of FIG. 1, radiation from a scene is directed through the lens 25 onto the photocathode 22. This radiation is absorbed by the photoemissive cathode 22 and the photoelectrons are generated and accelerated into the target 24. The electron beam from the electron gun 26 initially establishes and periodically reestablishes a reverse bias on the p-n junction formed within the target between the contact 60 and the wafer 50. The electrons enter through the layer 52 into the n-type body or substrate region 50 and produce corresponding patterns of electron-hole pairs in response to the electron bombardment. The holes diffuse to the junction of the diode formed and partially discharge the reverse bias. The electron beam from the electron gun 26 will recharge on a next scan and will produce an output pulse to the video output which is taken across the resistor 44. The operation is such that the electron gun 26 tends to charge the contact 60 to ground potential while the back plate formed by the layer 52 is at a positive potential of about 10 volts. The p-n junction formed between the contact 60 and the n-type substrate 50 has a reverse bias and when electron bombardment of the wafer is brought about, the conductive pad 60 will charge in a positive direction. These carriers generated in the n-type substrate 50 associated with one diode under low illumination will diffuse to that diode junction in a normal manner. As illumination is increased, the lateral diffusion of these carriers will be prevented by the built-in field of the surrounding n+ barrier 86 shown in FIG. 14. Under very strong illumination, the carrier concentration may be high enough to overcome this field and allow carriers to enter the n+ region 86. The lifetime of minority carriers in the region 86 is extremely short and recombination will take place before any of these carriers can enter the n region of an adjacent diode. In this manner, blooming due to lateral carrier diffusion will be curtailed. In the case of a p-type region 86, a bias of about 1 volt would be applied and the p-type region would act as sink.

It is, of course, obvious that other modifications will readily occur to those skilled in the art.

We claim as our invention:

1. A charge storage device of the type having a charge storage target with opposed first and second major target sides and reading electron beam means for scanning and selectively contacting portions of said second major target side, said target comprising a semiconductive wafer of a first conductivity type having a substantially planar first major surface and an opposed second major surface having an array of spaced apart pillar-like members projecting from the semiconductor wafer and recessed regions surrounding said pillar-like members, an electrically insulating layer provided on the surface of said recessed regions and the side walls of said pillar-like members of said second surface, the projecting end portion of each said pillar-like member comprising a region of semiconductive material of an opposite conductivity type to the first conductivity type of the wafer, and thus providing a rectifying junction between the regions of opposite conductivity type, an electrical conducting contact pad provided on the projecting end of each of said pillar-like members for contact by said reading means, which conducting contact pad extends laterally beyond the pillar-like member side walls and spaced above a portion of the insulated layer covered recessed regions, and which conducting contact pad extends downwardly along the pillar-like member insulated layer covered side walls.

2. The device set forth in claim 1 in which said electrical conducting contact pads are an epitaxial growth of similar material as that of said wafer but of an opposite type conductivity to thereby form said junction region within said pillar-like member.

3. The device set forth in claim 1 in which a diffused region of opposite conductivity to said wafer is provided within the upper portion of said pillar-like members to form junctions with said wafer and said electrical contact pads are an epitaxial growth of similar material and conductivity as said diffused regions and extend from said diffusion regions to cover the upper portion of said pillar-like members and extend out about its periphery to provide a contact pad of greater diameter than said piller-like member to thereby limit the exposure of said insulating coating to said reading means.

4. The device set forth in claim 1 in which a diffusion region of opposite conductivity type to said wafer is provided in the end region of said pillar-like member and said electrical contact pad is of electrically conductive metallic material of a greater diameter than said pillar-like member to thereby reduce the exposure of said insulating coating to said reading means.

5. The device set forth in claim 1, in which a diffused region of greater electrical conductivity is provided in at least a portion of the recessed surface of said second major surface and extending at least a portion of the way between the recessed surface and said first major surface of said wafer to inhibit lateral diffusion of carriers within the wafer.

6. The device set forth in claim 1 in which a diffused region having greater electrical conductivity of the same type as said wafer is provided between said recessed surface and said first major surface to prevent lateral diffusion of carriers within said wafer.

7. A charge storage device of the type having a charge storage target with opposed first and second major target sides and reading electron beam means for scanning and selectively contacting portions of said second major target side, said target comprising a semiconductive wafer of a first conductivity type having a substantially planar first major surface, and an opposed second major surface having an array of spaced apart pillar-like members projecting from the semiconductor wafer and recessed regions surrounding said pillar-like members, with the wafer region beneath said recessed regions having a diffused region of excess charge carrier of the same conductivity type as the wafer, an electrically insulating layer provided in the surface of said recessed regions and the walls of said pillar-like members of said second surface, epitaxially grown contact pads of semiconductive material of the conductivity type opposed to the wafer conductivity type provided on the end of each of said pillar-like members for contact by said reading means, with the interface between the contact pad and the pillar-like members comprising the rectifying junction, which contact pad extends laterally beyond the pillar-like member side walls and spaced above a portion of the insulated layer covered recessed regions, and which contact oad extends downwardly along the pillar-like member insulated layer covered side walls.

* * * * *